United States Patent [19]

Claxton et al.

[11] 3,918,009

[45] Nov. 4, 1975

[54] GUNN EFFECT PHASE MODULATOR

[75] Inventors: Dale H. Claxton, Hawthorne; Raymond P. Liccini, Los Angeles, both of Calif.

[73] Assignee: TRW Inc., Redondo Beach, Calif.

[22] Filed: Dec. 20, 1974

[21] Appl. No.: 534,602

[52] U.S. Cl. ................. 332/9 T; 307/299 R; 357/3; 331/107 G; 332/16 T; 332/52

[51] Int. Cl.[2] .. H03C 3/22; H03K 17/22; H03B 7/14

[58] Field of Search ......... 332/9 R, 9 T, 16 R, 16 T, 332/52; 307/299 R; 357/3; 331/107 G

[56] References Cited

UNITED STATES PATENTS

| | | | |
|---|---|---|---|
| 3,465,265 | 9/1969 | Kuru | 331/107 G X |
| 3,638,143 | 1/1972 | Higashi et al. | 331/107 G X |
| 3,836,989 | 9/1974 | Kataoka et al. | 307/299 R X |

OTHER PUBLICATIONS

Statz et al., "Frequency Modulation of Gunn Oscillators", IBM Tech. Disclosure Bulletin, p. 342, Vol. 11, No. 3, Aug. 1968, 331–107G.

*Primary Examiner*—Alfred L. Brody
*Attorney, Agent, or Firm*—Daniel T. Anderson, Esq.; Edwin A. Oser, Esq.; Jerry A. Dinardo

[57] ABSTRACT

A Gunn effect triode is modified to provide a phase modulator. It may, for example, generate a phase modulated output and may be used in a microwave modulator. It consists basically of a main branch and two side branches, each being biased below the threshold electric field. Domain nucleation is initiated by a trigger or input pulse applied to the main branch and the pulse may be diverted by triggered gates into a selected one of the two side branches. The effective length of each side branch is such that the desired phase modulated output pulse may be obtained from a selected one of the two side branches. The two output signals may, for example, be 0° and 180° out of phase or alternatively 90° and 270° out of phase with respect to the input pulse.

7 Claims, 5 Drawing Figures

GUNN EFFECT PHASE MODULATOR

BACKGROUND OF THE INVENTION

This invention relates generally to Gunn effect devices or triodes and particularly relates to a phase modulator.

The Gunn effect has been discovered in 1963 by J. B. Gunn who discovered that coherent microwave oscillations may be generated in bulk gallium arsenide semiconductor material. The physics of such Gunn effect devices has been explained in a book by S. M. Sze, "Physics of Semiconductor Devices" published by John Wiley and Sons 1969 (see particularly pages 731 – 784).

Specifically, a Gunn triode will amplify an input signal and operates may be the microwave region. The device itself is extremely small, that is on the order of 10 – 20 microns long. Even though the effect is a bulk effect, the thickness of the effective layer may be on the order of 1/10 of its length, that is 1 – 2 microns thick. Such devices are characterized not only by their small size, but by appreciable isolation between input and output terminals.

It is accordingly an object of the present invention to provide a Gunn effect phase modulator with the advantages inherent in Gunn effect devices including substantial isolation between input and output terminals.

Another object of the invention is to provide a phase modulator of the type discussed which is capable of replacing six elements normally required in a microwave biphase modulator system.

A further object is to provide a Gunn effect phase modulator capable of generating a biphase modulated output.

SUMMARY OF THE INVENTION

A Gunn effect phase modulator in accordance with the present invention comprises a substrate of semi-insulating material. This may, for example, consist of gallium arsenide having a resistivity on the order of $10^9$ ohms per centimeter. The gallium arsenide is relatively pure and hence has a high resistance. The Gunn effect is also exhibited by other materials including gallium and certain compound semiconductors such as InP indium phosphide.

A semiconductive material is disposed on the substrate. This semiconductive material must exhibit the Gunn effect and hence has a differential negative resistance and is capable of domain nucleation under proper bias conditions. This semiconductive material may consist of n-type gallium arsenide having an impurity concentration on the order of $10^{15}$ to $10^{17}$ atoms per cubic centimeter.

The semiconductive material has such a shape to provide a main branch and two side branches substantially parallel to each other and to the main branch. Each side branch is connected to the main branch by an interconnecting portion. Each of the three branches has two ohmic electrodes and means are provided for biasing the ohmic electrodes to provide a cathode and an anode and to create an electric field which is below the threshold field where domain nucleation begins.

The ohmic electrodes are of the conventional type and may consist of a metal coating such as tin or gold-germanium.

A Schottky barrier electrode may, for example, consist of a metal-semiconductor junction, for example, of gold on gallium arsenide.

A trigger or input pulse is applied to the Schottky electrode of the main branch. The trigger pulse must have a magnitude sufficient together with the electric field to initiate domain nucleation so that a dipole domain is formed and propagated in the main branch. Preferably, a series of equally spaced trigger pulses are applied.

Finally, means are provided for applying a gating pulse to a selected one of the interconnecting portions. This will cause the launched dipole domain to propagate in the selected side branch.

The side branches have each a predetermined length with respect to that of the main branch so that an output pulse derived from one of the side branches has a predetermined phase relationship with the input trigger pulse. For example, the two side branches may have such effective lengths that the output pulses have a phase of 0° and 180° or 90° and 270° with respect to the input pulse.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings.

DESCRIPTION OF THE PREFERRED EMBODIMENTS

Figure 1:
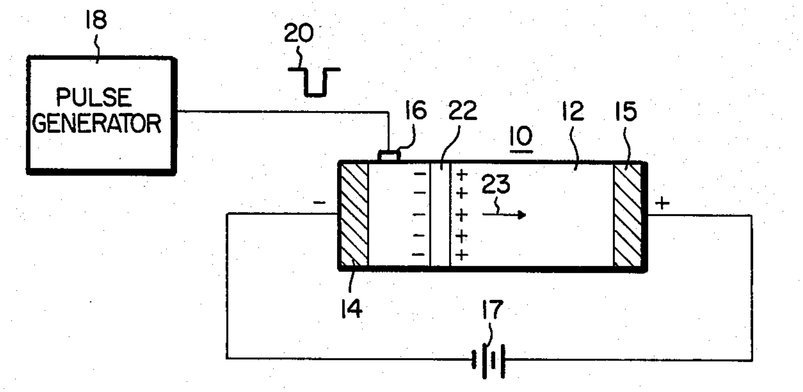
FIG. 1 is a schematic representation of a conventional Gunn triode for the purpose of explaining the Gunn effect and the operation of the triode.
Figure 2:
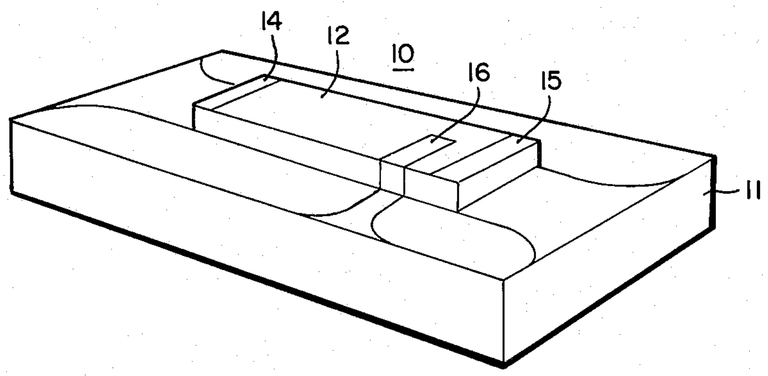
FIG. 2 is a view in perspective of a Gunn triode device to illustrate the substrate, the triode and its electrodes.

Referring now to FIG. 1, there is illustrated a conventional Gunn effect triode 10 which has been illustrated for the purpose of explaining the operation of such a device. Reference is also made to FIG. 2 which illustrates a physical embodiment of a Gunn effect triode. The triode has a substrate 11 of semi-insulating material as has previously been described. Disposed on the substrate 11 is a layer 12 of semiconductive material exhibiting the Gunn effect. As previously explained, the substrate 11 may consist of relatively pure gallium arsenide while the semiconductive material 12 may also consist of n-type gallium arsenide. Thus the substrate may have a resistivity of $10^9$ ohms per centimeter and the semiconductive layer 12 may have an impurity concentration of $10^{15}$ to $10^{17}$ atoms or charge carriers per cubic centimeter. The layer 12 may, for example, be grown epitaxially. Thus, for example, the layer may be grown from the vapor or gas phase or alternatively from the liquid phase, both systems being well known and conventional.

The device is further provided with a cathode 14 and an anode 15, each consisting of an ohmic contact. This may, for examle, be realized by a tin, or gold-germanium layer on the semiconductive material 12.

There is further provided a Schottky barrier electrode 16 which is a rectifying electrode and disposed adjacent the cathode 14. It may, for example, be realized by a gold contact on the gallium arsenide.

The bias voltage may be applied by a battery 17 connected between the cathode 14 and the anode 15. This will create an electric field which is below the threshold field necessary to create domain nucleation. The threshold field is on the order of 3.5 kilovolts per centimeter. This may be created by a corresponding threshold voltage. Finally, a pulse generator 18 may be connected to the Schottky barrier electrode 16 to apply negative going trigger pulses 20 thereto. These these trigger pulses 20 will now increase the electric field beyond the threshold field to create a dipole domain indicated at 22. The domain 22 travels toward the anode 15 as shown by arrow 23.

Gallium arsenide exhibits two potential wells or valleys in the conduction band of the material. Normally, the electrons are in the lower valley. This in turn will increase their energy but decrease their mobility and hence their drift velocity. Thus, the combined effect of the bias created by battery 17 and the applied trigger pulse 20 will exceed the threshold field and initiate nucleation. The electrons in the region 22 will now slow down causing an excess of electrons behind the region 22 and a deficiency of electrons ahead of the region 22 thus forming the dipole 22 which is now swept as shown by the arrow 23 toward the cathode 15.

The frequency of operation is determined by the drift velocity and the physical length of the device. The domain velocity is about $10^7$ centimeters per second and the device length on the order of 10 microns. For example, if the device is designed to operate at 10 gigahertz the transit time may be 100 picoseconds for a device having a length of 10 microns.

It will be evident that while one dipole domain 22 moves toward the cathode 15, no other dipole nucleation can take place. This effect in turn determines the highest possible frequency of operation of the device. However, as indicated above the physics and operation of a Gunn effect triode are well known as shown by the book above referred to.

Figure 3:
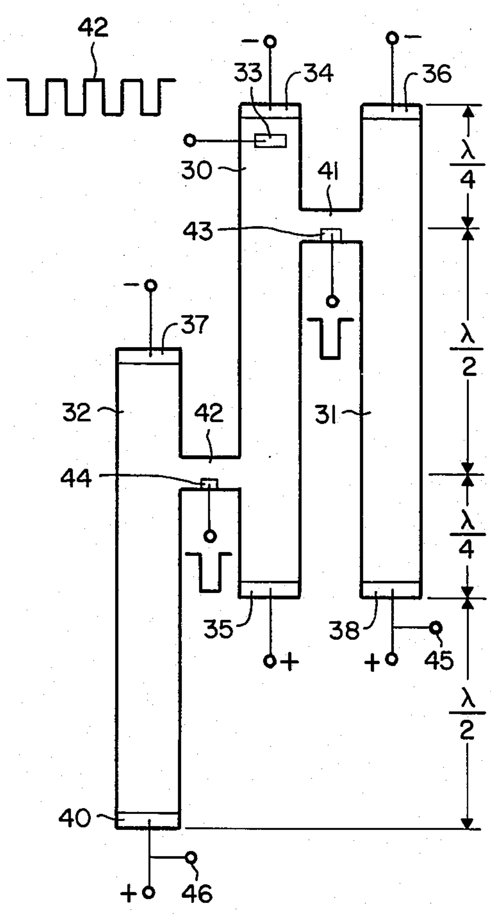
FIG. 3 is a schematic representation of one form of phase modulator which will generate a biphase modulated output.

A phase modulator in accordance with the present invention is illustrated in FIG. 3 to which reference is now made. The Gunn effect phase modulator of FIG. 3 comprises a main branch 30 and two side branches 31 and 32. The main branch is basically a Gunn triode while each of the side branches 31 and 32 operate as Gunn diodes, the difference being that the main branch has a Schottky barrier electrode 33 for applying trigger pulses.

The main branch 30 again has a cathode 34 and an anode 35. The Schottky electrode 33 is disposed near the cathode 34. Similarly, the side branches 31 and 32 have respectively cathodes 36, 37 and anodes 38, 40. Each of the side branches 31 and 32 is connected to the main branch by an interconnecting portion 41 and 42 respectively. A bias voltage is applied between each pair of cathodes and anode 34, 35; 36, 38; and 37, 40 as previously explained. Schottky barrier electrodes 43 and 44 are provided in the respective interconnecting portions 41 and 42.

The operation of the Gunn effect phase modulator is based on the transverse spreading effect which has first been described in the literature in 1971. In other words, even though a domain nucleates at a single point, it spreads about the equipotential lines at about ten times the electron drift velocity. This is due to the fact that propagation in the transverse direction is by electric field while particles cause propagation in the axial direction. Thus, when a train of trigger pulses is applied to the Schottky barrier electrode 33 nucleation will start, assuming that the bias voltage is less than the critical threshold field. This domain nucleation will spread into the interconnecting portion 41 and may be made to transfer toward the side branch 31 by the application of a negative or gating pulse on the Schottky barrier electrode 43 in the interconnecting branch 41. Alternatively, if a negative gating pulse is applied to the Schottky barrier electrode 44 in the interconnecting portion 42, the domain nucleation, that is the dipole domain will spread into the side branch 32.

In accordance with the present invention the effective length of the two side branches 31 and 32 is such that an output signal obtained at the output terminals 45 and 46 has a predetermined phase relationship with the input trigger pulse. Thus, as shown in FIG. 3, the length of the main branch 30 is λ corresponding to one wavelength of the induced oscillation. The side branch 31 has the same effective length, that is the same length between cathode 34 of the main branch and anode 38 of the side branch 31. Similarly, the side branch 32 has an effective length of 1½ λ, the effective length again being the length between the cathode 34 of the main branch 30 and the anode 40 of the side branch 32.

The main branch 30 being a triode is capable of oscillation. The oscillations may be sustained, for example, by making the bias voltage between cathode 34 and anode 35 greater than the threshold voltage. This will launch successive dipole domains in the main branch and the frequency is determined by the fact that no more than one dipole domain can exist at any time in the main branch 30. Alternatively, the same effect may be obtained by applying a series of equally spaced trigger pulses 42 which together with the bias voltage will exceed the threshold voltage. Finally, an external circuit connected between cathode 34 and anode 35 may be tuned to cause oscillations, all of which is well known in the art. As shown in FIG. 3, the oscillations are controlled by the trigger or input pulses 42.

The phase modulator of FIG. 3 may, for example, be used to generate a biphase modulated output signal in accordance with a data stream. The data stream may be applied simultaneously to the electrodes 43 and 44 and the occurrence of the data pulses in time controls whether the dipole domain will be permitted to propagate in either side branch 31 or in side branch 32. In this case, it is desirable to locate the interconnecting portion 41 one quarter wavelength below the cathode 34 of the main branch 30. Similarly, the interconnecting portion 42 may be located three quarters of a wavelength below the cathode 34 of the main branch 30. Therefore, the occurrence in time of the data pulses will selectively energize either side branch 31 or side branch 32. The data pulse will be out of phase by 90° and 270° with respect to an input pulse. As a result, an output signal obtained from output terminal 45 will be in phase with the input trigger pulse while the output pulse obtained from output terminal 46 will be 180° out of phase with respect thereto. Therefore, the biphase modulated output will be either 0° or 180° out of phase with respect to the input signal.

Figure 4:
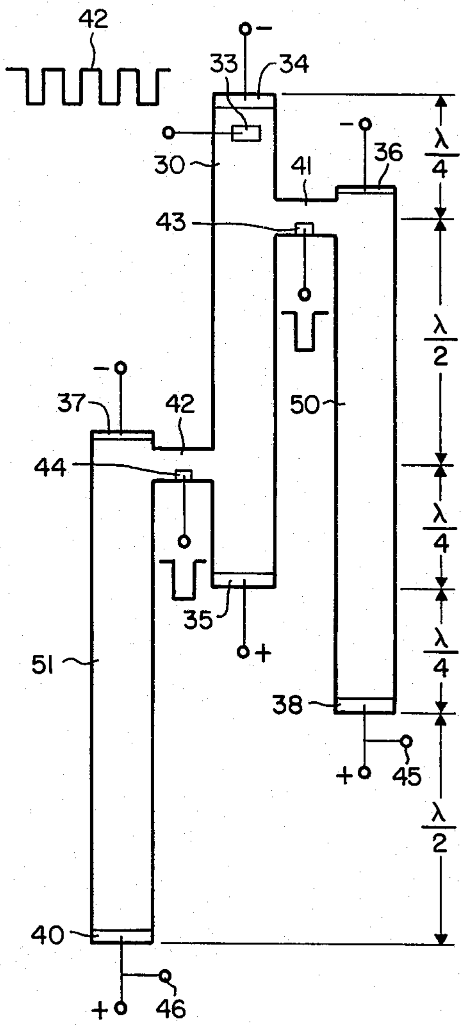
FIG. 4 is a schematic representation of another phase modulator in accordance with the invention for generating a different biphase modulated output.

FIG. 4 illustrates another example of a Gunn effect phase modulator in accordance with the present invention capable of generating two output pulses which are respectively 90° and 270° out of phase with respect to the input pulse. The phase modulator of FIG. 4 again has a main branch 30 identical with that of FIG. 3 and two interconnecting portions 41 and 42 also identical with those of FIG. 3. However, the two side branches 50 and 51 now have a different relationship. Again, the side branches have the same electrodes as previously described and the interconnecting portions are each provided with a Schottky barrier electrode or gate. However, the effective length of the main branch 50 is now 1¼ wavelength while that of side branch 51 is 1¾ wavelength. The effective lengths of the side branches are again determined as previously described. On the other hand, the interconnecting portions 41 and 42 have the same location with respect to the main branch. Therefore, the output signal obtained at output terminal 45 is 90° out of phase and that obtained from output terminal 46 is 270° out of phase with respect to the input trigger pulse.

It will, therefore, be seen that by a simple change of the effective lengths of the side branches, different phase relationships of the output signals may be readily obtained.

For X band operation the length of each branch or leg maybe on the order of 10 microns which yields an enormous space savings over conventional modulators. Since the entire device is so small, it can readily be heated to the maximum ambient temperature at which it would have to operate thus eliminating temperature effects.

Finally, the isolation between the main branch and the side branches is on the order of 20 – 30 db in the forward direction. Hence changing load conditions or even changes in the input data stream cannot substantially affect the main branch 30.

Figure 5:
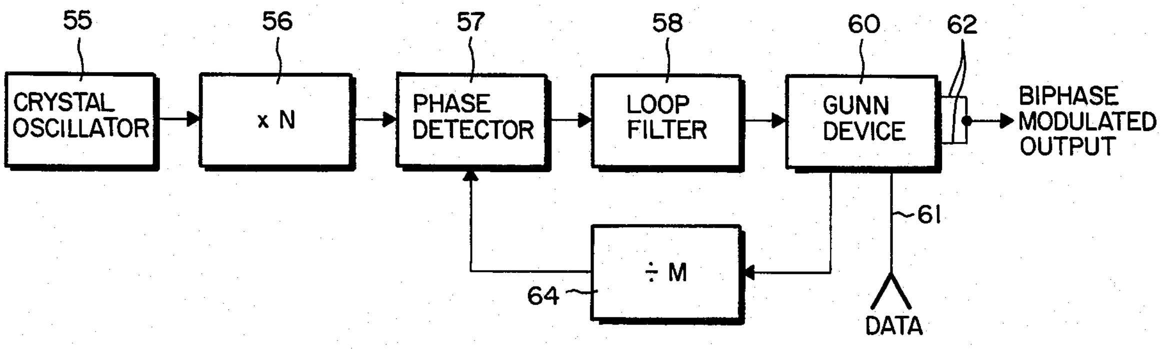
FIG. 5 is a block diagram of a microwave phase modulator system including the Gunn device of the invention which will generate a biphase modulated output.

FIG. 5 illustrates, by way of example, a cmplete phases modulator system including a phase-locked loop utilizing the Gunn device of the present invention. The entire phase modulator system includes a crystal oscillator 55, a multiplier 56 which multiplies the oscillator frequency by N, followed by a phase detector 57. This is followed by a loop filter 58 and the Gunn effect modulator 60 of the present invention. The data is applied by the line 61 which is impressed on the gates 43 and 44 of the device of FIGS. 3 and 4. The biphase modulated output is obtained from the output leads 62 which are connected to the output terminals 45 and 46. Finally, a frequency divider 64 which divides the frequency by M is connected between the Gunn device 60 and the phase detector 57 to complete the phase-locked loop. The output of the loop filter 58 provides the trigger or input pulses applied to the trigger electrode 33. Finally, the output obtained from electrode 35 is fed back into the frequency divider 64. It will be seen that the phase modulator system of FIG. 5 eliminates the following conventionally used components: the voltage controlled oscillator, directional coupler circulator, isolator, diode and quarterwave line, all of which is replaced by the Gunn effect device of the invention.

There has thus been disclosed a phase modulator making use of the Gunn effect. The phase modulator is characterized by its extremely small size and simplicity. It replaces six components conventionally used in a phase modulator system. It also provides great forward isolation along each of the side branches so that changing load conditions or changes in the input data stream cannot significantly affect the main branch which thus will maintain oscillations at a precise rate.

What is claimed is:

1. A Gunn effect phase modulator comprising:

a. a substrate of semi-insulating material;

b. a semiconductive material disposed on said substrate, said semiconducting material exhibiting the Gunn effect and having differential negative resistance and capable of domain nucleation;

c. said semiconductive material having a main branch and two side branches substantially parallel to each other and to said main branch, each of said side branches being connected to said main branch by an interconnecting portion;

d. each of said three branches having two ohmic electrodes;

e. means for biasing said ohmic electrodes to provide a cathode and an anode and to create an electric field in said semiconduction material below the threshold field where domain nucleation begins;

f. a Schottky barrier electrode disposed near the cathode of said main branch and a Schottky barrier electrode on each of said interconnecting portions;

g. means for applying an input trigger pulse to said Schottky electrode of said main branch having a magnitude sufficient together with said electric field to initiate domain nucleation whereby a dipole domain is formed in said main branch;

h. means for applying a gating pulse to a selected one of the Schottky electrode of said interconnecting portions whereby the launched dipole domain will either propagate in one or the other of said side branches, said side branches having each a predetermined length with respect to the length of said main branch, whereby an output pulse may be obtained at the anode of one of said side branches having a predetermined phase relationship with the input pulse.

2. A phase modulator as defined in claim 1 wherein said substrate consists of gallium arsenide and wherein said semiconducting material consists of n-type, doped gallium arsenide.

3. A phase modulator as defined in claim 2 wherein one of said interconnecting portions is spaced from the cathode of said main branch by ¼ of the wavelength of the oscillations in said main branch while the other one of said interconnecting portions is spaced from the cathode of said main branch by ¾ of said wavelength.

4. A phase modulator as defined in claim 3 wherein one of said side branches has an effective length equal to that of said main branch while the other one of said side branches has an effective length of one and a half times that of said main branch, whereby the phase of the output pulses obtained from said side branches are respectively 0° and 180° out of phase with respect to the phase of the input pulse.

5. A phase modulator as defined in claim 3 wherein one of said side branches has an effective length of one and one quarter that of said main branch while the other one of said side branches has a length of one and three quarters that of said main branch, whereby the output signals obtained from said side branches are respectively 90° and 270° out of phase with respect to that of the input pulse.

6. A phase modulator as defined in claim 2 wherein a series of equally spaced trigger pulses is applied to the Schottky electrode of said main branch.

7. A phase modulator as defined in claim 2 wherein data pulses are applied simultaneously to both of the Schottky electrodes of said interconnecting portion, whereby a selected one of said side branches is gated.

* * * * *